United States Patent
Fujita et al.

(10) Patent No.: US 12,217,948 B2
(45) Date of Patent: Feb. 4, 2025

(54) SPUTTERING TARGET, METHOD OF BONDING TARGET MATERIAL AND BACKING PLATE, AND METHOD OF MANUFACTURING SPUTTERING TARGET

(71) Applicant: SUMITOMO CHEMICAL COMPANY, LIMITED, Tokyo (JP)

(72) Inventors: Masahiro Fujita, Osaka (JP); Koji Nishioka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 231 days.

(21) Appl. No.: 17/213,757

(22) Filed: Mar. 26, 2021

(65) Prior Publication Data
US 2022/0310371 A1  Sep. 29, 2022

(51) Int. Cl.
  *H01J 37/34* (2006.01)
  *C23C 14/34* (2006.01)

(52) U.S. Cl.
  CPC ...... *H01J 37/3417* (2013.01); *C23C 14/3407* (2013.01); *H01J 37/3432* (2013.01); *H01J 37/3435* (2013.01); *H01J 2237/332* (2013.01)

(58) Field of Classification Search
None
See application file for complete search history.

(56) References Cited

U.S. PATENT DOCUMENTS

| | | | | |
|---|---|---|---|---|
| 6,071,389 A | * | 6/2000 | Zhang | B23K 20/021 419/48 |
| 2004/0081836 A1 | | 4/2004 | Inoue et al. | |
| 2004/0099524 A1 | * | 5/2004 | Georgens | C23C 14/35 204/192.12 |
| 2004/0262157 A1 | | 12/2004 | Ford et al. | |
| 2005/0067469 A1 | * | 3/2005 | Facey | C23C 14/3407 228/245 |
| 2006/0234088 A1 | | 10/2006 | Inoue et al. | |

(Continued)

FOREIGN PATENT DOCUMENTS

| | | |
|---|---|---|
| JP | 6-114549 A | 4/1994 |
| JP | 8-216166 A | 8/1996 |

(Continued)

OTHER PUBLICATIONS

English translation of the Notification of Reasons for Revocation issued in Japanese Patent No. 5755422 dated Jun. 3, 2021.

(Continued)

*Primary Examiner* — Jason Berman
(74) *Attorney, Agent, or Firm* — Birch, Stewart, Kolasch & Birch, LLP

(57) ABSTRACT

A sputtering target comprising:
  a backing plate; and
  a target material bonded via a bonding material to a bonding region of the backing plate, wherein
  a bonding area of a bonding portion between the target material and the backing plate accounts for 97% or more of the area of the bonding region, and wherein
  a maximum defect area of portions without the bonding material present between the target material and the backing plate accounts for 0.6% or less of the area of the bonding region.
The sputtering target enables manufacturing of the sputtering target in which the target material is hardly peeled off during sputtering.

6 Claims, 6 Drawing Sheets

(56) References Cited

U.S. PATENT DOCUMENTS

| | | | |
|---|---|---|---|
| 2006/0292310 A1* | 12/2006 | Le | C23C 14/042 427/446 |
| 2008/0006528 A1 | 1/2008 | Gilman et al. | |
| 2008/0063889 A1* | 3/2008 | Duckham | C23C 28/321 228/208 |
| 2008/0236738 A1* | 10/2008 | Lo | C23C 14/3407 156/283 |
| 2008/0309223 A1 | 12/2008 | Inoue et al. | |
| 2012/0228132 A1 | 9/2012 | Koido | |
| 2020/0384598 A1 | 12/2020 | Fujita et al. | |

FOREIGN PATENT DOCUMENTS

| | | |
|---|---|---|
| JP | 11-106904 A | 4/1999 |
| JP | 11-131225 A | 5/1999 |
| JP | 11-131226 A | 5/1999 |
| JP | 2002-30431 A | 1/2002 |
| JP | 3829367 B2 * | 10/2006 |
| JP | 2009-242915 A | 10/2009 |
| JP | 5175976 B2 | 4/2013 |
| JP | 2014-5517 A | 1/2014 |
| JP | 2017-193779 A | 10/2017 |
| JP | 6397592 B1 | 9/2018 |
| TW | 201035340 A1 | 10/2010 |
| WO | WO 2011/062002 A1 | 5/2011 |

OTHER PUBLICATIONS

International Preliminary Report on Patentability and English translation of the Written Opinion of the International Searching Authority issued in International Application No. PCT/JP2020/003396 dated Aug. 10, 2021.

Taiwanese Office Action and Search Report for Taiwanese Application No. 109102934, dated Jul. 26, 2021, with English translation.

Chemistry Dictionary 1 (including a partial English translation thereof), Kyoritsu Publishing Co., Mar. 30, 1960, pp. 436-437 and 714-714.

International Search Report (including an English translation thereof) issued in International Application No. PCT/JP2020/003396 dated Mar. 10, 2020.

Japanese Notice of Reasons for Refusal (including an English translation thereof) issued in Japanese Patent Application No. 2019-201625 dated Dec. 10, 2019.

Japanese Notice of Reasons for Refusal (including an English translation thereof) issued in Japanese Patent Application No. 2020-009426 dated Mar. 24, 2020.

Japanese Notification of Reasons for Revocation issued in Japanese Patent No. 6755422 dated Jun. 3, 2021.

Taiwanese Office Action issued in the corresponding Taiwanese Patent Application No. 111108683 dated Jun. 17, 2022.

Japanese Submissions for Publications for Japanese Application No. 2020-141622, dated Dec. 13, 2022, with English translation.

Malaysian Office Action and Search Report for Malaysian Application No. PI 2021001788, dated Mar. 16, 2023.

U.S. Office Action for U.S. Appl. No. 18/311,491, dated Dec. 20, 2023.

* cited by examiner

SPUTTERING TARGET, METHOD OF BONDING TARGET MATERIAL AND BACKING PLATE, AND METHOD OF MANUFACTURING SPUTTERING TARGET

TECHNICAL FIELD

The present invention relates to a sputtering target, a method of bonding a target material and a backing plate, and a method of manufacturing a sputtering target.

BACKGROUND ART

A conventional method of bonding a sputtering target is described in Japanese Laid-Open Patent Publication No. 6-114549 (Patent Document 1). In this method of bonding a sputtering target, molten brazing material coatings are respectively formed on the target material and the backing plate, the target material and the backing plate are relatively moved and overlapped while being rubbed with each other, thereby squeezing out an oxide generated on a coating surface, so that the brazing material coatings are integrated without the oxide and air bubbles being caught, and subsequently, the brazing material is cooled and solidified for brazing.

PRIOR ART DOCUMENT

Patent Document

Patent Document 1:Japanese Laid-Open Patent Publication No. 6-114549

SUMMARY OF THE INVENTION

Problem to be Solved by the Invention

It was found that the conventional method of bonding a sputtering target is not sufficient for bonding the target material and the backing plate and that the target material may be peeled off during sputtering. As a result of intensive studies, the present inventor focused that in the conventional method, a rate (bonding rate) of an actually bonded area (bonding area) to an area of a region (bonding region) where the target material and the backing plate should be bonded was small, and an area (maximum defect area) of a portion having the largest area among portions (unbonded portions) without a bonding material located between the target material and the backing plate was large. Thereby the present inventor found the presence of a relationship of the bonding rate and the maximum defect area to the peeling of the target material.

Therefore, an object of the present invention is to provide a sputtering target, a method of bonding a target material and a backing plate, and a method of manufacturing a sputtering target, capable of implementing a sputtering target in which the target material is hardly peeled off during sputtering.

Means for Solving Problem

To solve the problem, an embodiment of the sputtering target comprises
a backing plate; and
a target material bonded via a bonding material to a bonding region of the backing plate (a region to be bonded to the target material in the backing plate),
a bonding area of a bonding portion (bonded portion) between the target material and the backing plate accounts for 97% or more of the area of the bonding region, and
a maximum defect area of unbonded portions between the target material and the backing plate accounts for 0.6% or less of the area of the bonding region.

According to the embodiment, a bonding rate can be improved, and the maximum defect area can be reduced, so that the sputtering target with the target material hardly peeled off can be manufactured.

In an embodiment of the sputtering target, the area of the bonding region is 13000 mm$^2$ or more.

According to the embodiment, the sputtering target with the target material hardly peeled off can be manufactured even when the sputtering target has a large bonding region.

In an embodiment of the sputtering target, the length of the target material is 1000 mm or more and 4000 mm or less.

According to the embodiment, the sputtering target with the target material hardly peeled off can be manufactured even when the sputtering target has an elongated shape.

An embodiment of a method of bonding a target material and a backing plate is a method of bonding a target material and a backing plate with a bonding material, comprising the steps of:
applying the bonding material to a region (bonding region) to be bonded to the target material on a principal surface of the backing plate;
sliding and moving the target material in a first direction along the principal surface of the backing plate so that an edge (a first edge) of the target material is moved from a first edge side of the bonding region of the backing plate to a position beyond a second edge facing the first edge in the first direction in the bonding region of the backing plate; and
sliding and moving the target material in a second direction opposite to the first direction along the principal surface of the backing plate to match the target material with the bonding region of the backing plate.

Hereinafter, sliding and moving the target material in the first direction is also referred to as "slide", and sliding and moving the target material in the second direction is also referred to as "reverse".

According to the embodiment, the target material is slid in the first direction relative to the backing plate and then reversed in the second direction to match the target material with the bonding region of the backing plate. As a result, when the target material and the backing plate are bonded, the bonding rate can be improved, and the size of the maximum defect area having the largest area among the unbonded portions can be reduced. Therefore, the sputtering target with the target material hardly peeled off can be manufactured.

In an embodiment of the method of bonding a target material and a backing plate,
the target material and the backing plate are formed in an elongated shape,
the edge of the target material is formed along a longitudinal direction of the target material,
the first edge and the second edge of the bonding region of the backing plate are formed along a longitudinal direction of the backing plate and face each other in a transverse direction of the backing plate, and
the target material is slid and moved in the transverse direction of the backing plate relative to the backing plate.

According to the embodiment, when each of the target material and the backing plate has an elongated shape, a movement distance of the target material can be reduced with respect to the backing plate, and a working time can be shortened.

In an embodiment of the method of bonding a target material and a backing plate, a step of arranging a plurality of wires on the principal surface of the backing plate is included before the step of applying the bonding material, and when the target material is moved in the first direction and the second direction, the target material is slid and moved on the wires.

According to the embodiment, since the target material is slid on the wires, the target material can easily be moved while keeping the surface to be bonded (bonding surface) of the target material and the surface to be bonded (bonding surface) of the backing plate substantially parallel to each other, so that the bonding rate can be improved. Since the wires function as a spacer, the thickness of the bonding layer formed of the bonding material between the target material and the backing plate can be made constant.

In an embodiment of the method of bonding a target material and a backing plate, the diameter of the wires is 0.05 mm or more and 0.5 mm or less.

According to the embodiment, wire breakage can be prevented, and the thickness of the bonding layer formed of the bonding material can be prevented from becoming uneven.

In an embodiment of the method of bonding a target material and a backing plate, a step of replenishing the bonding material on the first edge side of the bonding region of the backing plate is included between the step of moving the target material in the first direction and the step of moving the target material in the second direction.

According to the embodiment, since the bonding material is replenished on the first edge side of the bonding region of the backing plate, the bonding material can be replenished on the first edge side of the bonding region where the bonding material is likely to be insufficient, so that the bonding rate can further be improved, and the maximum defect area can further be reduced.

In an embodiment of the method of bonding a target material and a backing plate, when the edge (first edge) of the target material is moved to a position beyond the second edge of the bonding region of the backing plate at the step of moving the target material in the first direction, and it is assumed that A is a distance in the first direction from the second edge of the bonding region of the backing plate to the edge (first edge) of the target material and that W is a width of the bonding region in the first direction, $0.03 \leq A/W < 1.0$ is satisfied.

According to the embodiment, the bonding rate can be improved, and the maximum defect area can be reduced while shortening the movement distance of the target material with respect to the backing plate.

In an embodiment of the method of bonding a target material and a backing plate, when the edge (first edge) of the target material is arranged on the first edge side of the bonding region of the backing plate at the step of moving the target material in the first direction, and it is assumed that B is a distance in the first direction from the first edge of the bonding region of the backing plate to the edge (first edge) of the target material and that W is a width of the bonding region in the first direction, $B/W < 2.0$ is satisfied.

According to the embodiment, since the movement distance of the target material can be reduced with respect to the backing plate and the target material can be placed on the backing plate before sliding, the bonding rate can be improved, and the size of the maximum defect area can be reduced.

In an embodiment of a method of manufacturing a sputtering target, the target material and the backing plate are bonded by using the method of bonding described above to manufacture the sputtering target.

According to the embodiment, when the target material and the backing plate are bonded, the bonding rate can be improved, and the size of the maximum defect area having the largest area among the unbonded portions can be reduced. Therefore, the sputtering target with the target material hardly peeled off can be manufactured.

Effect of the Invention

The sputtering target, the method of bonding a target material and a backing plate, and the method of manufacturing a sputtering target of the present invention enables manufacturing of the sputtering target in which the target material is hardly peeled off during sputtering.

MODES FOR CARRYING OUT THE INVENTION

The present invention will now be described in detail with reference to illustrated embodiments.

Embodiments

FIGS. 1A to 1E are explanatory views showing a method of bonding a target material and a backing plate of the present invention (hereinafter referred to as a "bonding method"). As shown in FIGS. 1A to 1E, this method is a method of bonding a target material 2 and a backing plate 3 with a bonding material 4.

Figure 1A:
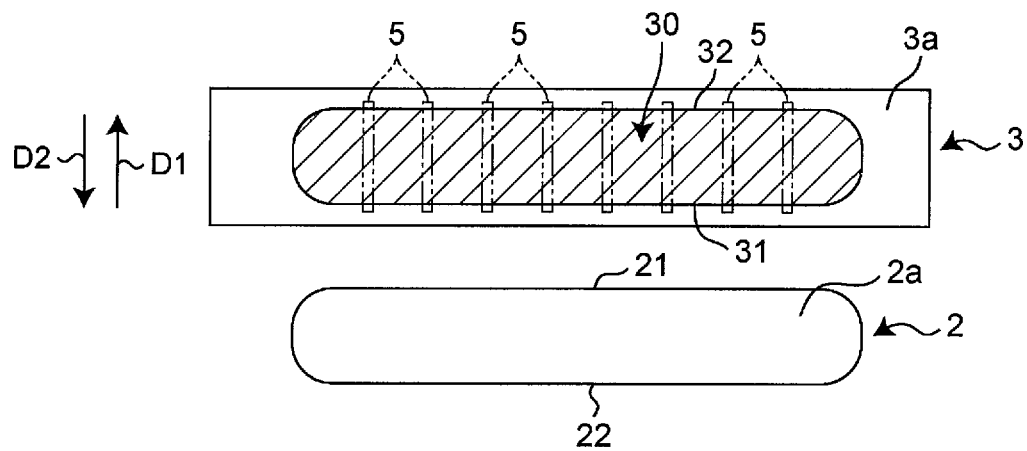
FIG. 1A is an explanatory view showing an embodiment of a method of bonding a target material and a backing plate of the present invention.

As shown in FIG. 1A, the target material 2 and the backing plate 3 are prepared. The target material 2 is formed in an elongated plate shape. The length of the target material 2 in a long-side (longitudinal) direction is, for example, 1000 mm or more, preferably 1500 mm or more, more preferably 2000 mm or more, further preferably 2200 mm or more, and 4000 mm or less, preferably 3500 mm or less, more preferably 3200 mm or less, further preferably, 3000 mm or less. The length of the target material 2 in a short-side (transverse) direction is, for example, 100 mm or more, preferably 120 mm or more, more preferably 130 mm or more, further preferably 150 mm or more, and 2500 mm or less, preferably 2000 mm or less, more preferably 1000 mm or less, further preferably 500 mm or less, particularly preferably 300 mm or less. The length in the long-side direction and the length in the short-side direction may be the same or different. When the target material 2 has an elongated plate shape, an area of a surface perpendicular to the thickness direction of the target material 2 (i.e., a sputtering surface 2a, or a surface on the back side of the sputtering surface 2a) is 13000 mm$^2$ or more, preferably 15000 mm$^2$ or more, more preferably 35000 mm$^2$ or more, further preferably 50000 mm$^2$ or more, still further preferably 100000 mm$^2$ or more, particularly preferably 275000 mm$^2$ or more, and 7500000 mm$^2$ or less, preferably 5000000 mm$^2$ or less, more preferably 2000000 mm$^2$ or less, further preferably 1000000 mm$^2$ or less, particularly preferably 750000 mm$^2$ or less. The thickness of the target material 2 is, for example, 5 mm or more and 40 mm or less, preferably 10 mm or more and 30 mm or less, more preferably 12 mm or more and 25 mm or less. In the present invention, even when a target material for a large flat panel display is used, an improvement in the bonding rate and a reduction in the maximum defect area in the entire bonding region can be implemented.

An aspect ratio of the length in the long-side direction and the length in the short-side direction (the length in the long-side direction/the length in the short-side direction) of the sputtering target is 1 or more and 30 or less, preferably 5 or more and 25 or less, more preferably 6 or more and 20 or less, further preferably 7 or more and 18 or less, and particularly preferably 8 or more and 15 or less. As a result, although the sputtering target has an elongated shape, an effect of a reverse step is easily produced, and a sputtering target having a high bonding rate and a small maximum defect area can be manufactured.

The target material 2 has the sputtering surface 2a on an upper surface. The target material 2 has a first edge 21 and a second edge 22 corresponding to the long sides when viewed from the upper surface. The first edge 21 and the second edge 22 are formed along the longitudinal direction of the target material 2, and the first edge 21 and the second edge 22 are arranged to face each other in the transverse direction of the target material 2.

The target material 2 has a surface (bonding surface) to be bonded to the backing plate on the back side of the sputtering surface 2a serving as the upper surface. The size of the bonding surface is usually substantially equal to the size of the target material 2 or may be smaller than the area of the target material 2 (the length in the long-side direction×the length in the short-side direction; the area in a plan view if an R part exists) due to removal of burrs generated on the bonding surface during machining and removal of corners causing an abnormal discharge. The area of the bonding surface may have a size of usually 95% or more, preferably 98% or more, more preferably 99% or more of the area of the target material 2.

During the target material 2 is being sputtered, an inert gas ionized by sputtering collides with the sputtering surface 2a. Target atoms contained in the target material 2 are ejected from the sputtering surface 2a with which the ionized inert gas collides. The ejected atoms are deposited on a substrate arranged to face the sputtering surface 2a, and a thin film is formed on the substrate.

A material used for producing the target material 2 is not particularly limited as long as the material is composed of metal, alloy, oxide, ceramics such as nitride, or a sintered body that may usually be used for film formation by a sputtering method, and the target material may appropriately be selected depending on application and purpose. For example, the target material may be produced from a material selected from the group consisting of metals such as aluminum, copper, chromium, iron, tantalum, titanium, zirconium, tungsten, molybdenum, niobium, indium, silver, cobalt, ruthenium, platinum, palladium, and nickel, and alloys thereof, indium tin oxide (ITO), aluminum-doped zinc oxide (AZO), gallium-doped zinc oxide (GZO), and In—Ga—Zn-based composite oxide (IGZO). The material forming the target material 2 is not limited thereto. For example, for the material of the target material 2 for electrode or wiring material, Al or Al alloy is preferable and, for example, it is particularly preferable to use Al having a purity of 99.99% or more, more preferably 99.999% or more, and Al alloys obtained by using them as a base material (Al—Cu, Al—Si, Al—Cu—Si). High-purity Al has a relatively large coefficient of linear thermal expansion, therefore easily warps due to heat received during sputtering, and easily peels off from the backing plate; however, the present invention can improve the bonding rate to reduce the maximum defect area and can prevent the peeling from the backing plate.

The backing plate 3 is formed into an elongated plate shape. The length of the backing plate 3 in the long-side direction is, for example, 1000 mm or more and 4500 mm or less, preferably 1500 mm or more and 4000 mm or less, more preferably 2000 mm or more and 3500 mm or less, further preferably 2500 mm or more and 3200 mm or less. The length of the backing plate 3 in the short-side direction is, for example, 100 mm or more and 2000 mm or less, preferably 150 mm or more and 1200 mm or less, more preferably 180 mm or more and 750 mm or less, further preferably 200 mm or more and 350 mm or less. In this description, one of the transverse directions of the backing plate 3 is defined as a first direction D1, and the other transverse direction of the backing plate 3 opposite to the first direction D1 is defined as the second direction D2.

The backing plate 3 has a bonding region 30 (indicated by hatching) on a principal surface 3a of an upper surface. The bonding region 30 is a region to which the target material 2 should be bonded. The shape of the bonding region 30 corresponds to the shape of the target material 2. Therefore, although the size of the bonding region 30 may be smaller than the size of the bonding surface of the target material 2, the size is substantially the same as the size of the bonding surface of the target material 2, preferably the size of the target material 2. When the target material 2 is formed in an elongated plate shape, the area of the bonding region 30 is 13000 mm² or more, preferably 15000 mm² or more, more preferably 35000 mm² or more, further preferably 50000 mm² or more, still further preferably 100000 mm² or more, particularly preferably 275000 mm² or more, and 7500000 mm² or less, preferably 5000000 mm² or less, more preferably 2000000 mm² or less, further preferably 1000000 mm² or less, and particularly preferably 750000 mm² or less.

The bonding region 30 has a first edge 31 and a second edge 32 corresponding to the long sides when viewed from the upper surface. The first edge 31 and the second edge 32 are formed along the longitudinal direction of the backing plate 3, and the first edge 31 and the second edge 32 are arranged to face each other in the transverse direction of the backing plate 3. The second edge 32 is located in the first direction D1 from the first edge 31.

The backing plate 3 is composed of a conductive material and is made of metal, alloy thereof, etc. Examples of the metal include copper, copper alloy, aluminum, aluminum alloy, titanium, SUS, etc.

The bonding surface of the target material 2 and the bonding region 30 of the backing plate 3 are preferably flat and have a flatness of 1.0 mm or less, preferably 0.5 mm or less, more preferably 0.3 mm or less from the viewpoints of slipperiness when the target material 2 is slid or reversed and easiness of reduction of the maximum defect area. The flatness is a numerical value indicative of smoothness (evenness) of a plane and refers to a magnitude of deviation from a geometrically correct plane of a planar feature. Additionally, from the viewpoint of preventing the bonding material from flowing on the bonding region 30 of the backing plate 3 at the time of bonding, the backing plate 3 may have the principal surface 3a of the upper surface substantially parallel, preferably parallel, to the back surface thereof. From the viewpoint of facilitating application of a constant force to the target material 2 when the target material 2 is slid or reversed, the target material 2 may have the sputtering surface 2a of the upper surface substantially parallel, preferably parallel, to the bonding surface, which is the back surface thereof.

Figure 1B:
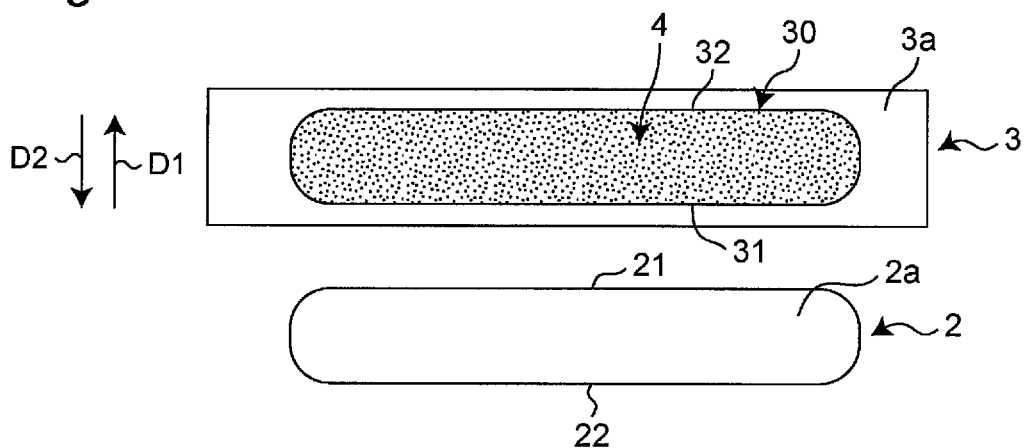
FIG. 1B is an explanatory view showing the embodiment of the method of bonding a target material and a backing plate of the present invention.

A bonding step is performed while the target material 2, the backing plate 3, and the bonding material 4 are heated. As shown in FIG. 1B, the bonding material 4 is applied to the entire surface of the bonding region 30 of the backing plate 3. An amount of the bonding material 4 to be applied is $1.5 \times 10^{-6}$ kg/mm² or more, preferably $2.5 \times 10^{-6}$ kg/mm² or more, more preferably $4.5 \times 10^{-6}$ kg/mm² or more, further preferably $10 \times 10^{-6}$ kg/mm² or more, and still further preferably $14 \times 10^{-6}$ kg/mm² or more. Although the upper limit is not particularly limited, the amount is preferably $50 \times 10^{-6}$ kg/mm² or less, more preferably $35 \times 10^{-6}$ kg/mm² or less, further preferably $25 \times 10^{-6}$ kg/mm² from the viewpoint of workability in the bonding step. The bonding material 4 is made of, for example, a metal having a low melting point (e.g., 723K or less) such as solder or a brazing material; materials of the solder are, for example, metals such as indium, tin, zinc, lead, silver, copper, bismuth, cadmium, and antimony, or alloys thereof and are, for example, In material, In—Sn material, Sn—Zn material, Sn—Zn—In material, In—Ag material, Sn—Pb—Ag material, Sn—Bi material, Sn—Ag—Cu material, Pb—Sn material, Pb—Ag material, Zn—Cd material, Pb—Sn—Sb material, Pb—Sn—Cd material, Pb—Sn—In material, and Bi—Sn—Sb material; and solder materials such as In, In alloy, Sn, and Sn alloy generally having a low melting point are preferably used. When the bonding is performed at a temperature equal to or higher than the melting point at which the bonding material 4 melts, preferably 140° C. or higher, more preferably 150° C. or higher and 300° C. or lower, and the viscosity of the molten bonding material 4 is 0.5 mPa·s or higher, preferably 1.0 mPa·s or more, more preferably 1.5 mPa·s or more and is 5 mPa·s or less, preferably 3 mPa·s or less, and more preferably 2.5 mPa·s or less, the bonding rate can be improved, and the maximum defect area can be reduced. Before bonding the target material 2 and the backing plate 3, the bonding surface of the target material 2 for the backing plate 3 and the bonding surface of the backing plate 3 for the target material 2 can be subjected to pre-processing (metallizing processing) for improving wettability for the bonding material 4. For the pretreatment, surface roughening such as polishing and grinding, hairline processing, embossing, and metallizing can be performed, and a polished surface, a ground surface, a hairline surface, an uneven surface such as an embossed surface, or a metallized layer can be formed on each of the bonding surfaces of the target material 2 and the backing plate 3. For example, the polishing process can be performed manually with a polishing material obtained by applying abrasive grains to paper or a fiber base material, or by using a polishing machine to which the polishing material is attached. The metallizing can be performed by a method such as applying a metallizing material to the bonding surface and performing ultrasonic irradiation. A metallizing material can be selected from the same materials as the bonding material 4, and for example, the In material and the Sn—Zn material can be used. A thickness of the metallized layer is 1 µm or more and 100 µm or less, and when the thickness is within this range, the wettability for the bonding material 4 is easily ensured, and the bonding rate is easily improved. Non-bonding portions of the target material 2 and the backing plate 3 may be masked in advance with a heat-resistant tape to prevent adhesion of the bonding material 4 and formation of the metallized layer.

Figure 1C:
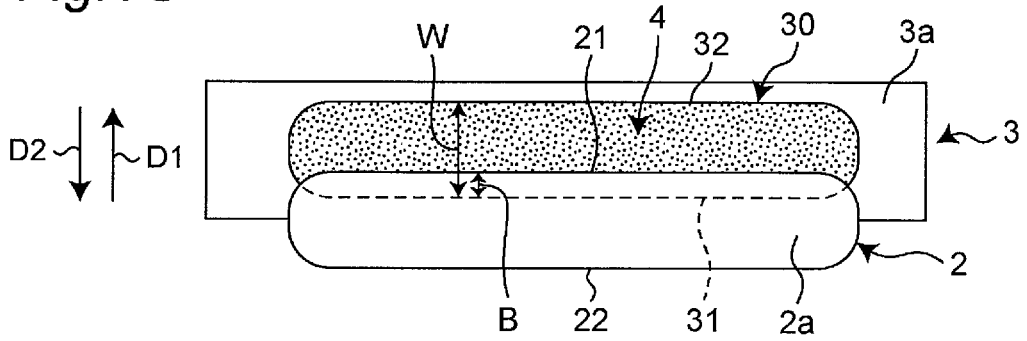
FIG. 1C is an explanatory view showing the embodiment of the method of bonding a target material and a backing plate of the present invention.

As shown in FIG. 1C, subsequently, the first edge 21 of the target material 2 is placed on the first edge 31 side of the bonding region 30 of the backing plate 3. In this case, preferably, the first edge 21 of the target material 2 is arranged to overlap the bonding region 30.

Figure 1D:
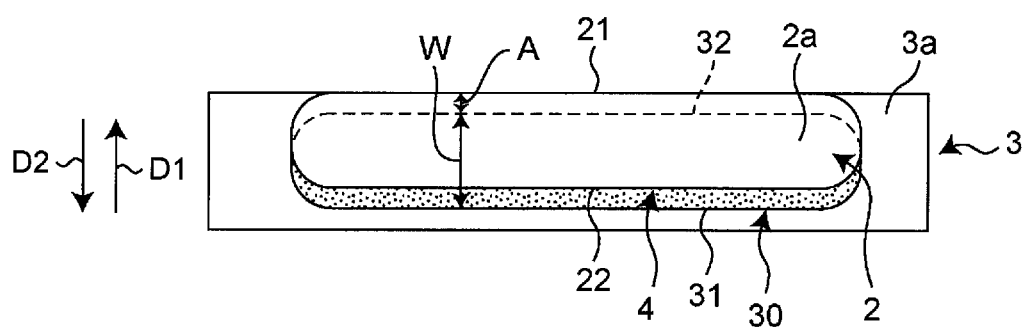
FIG. 1D is an explanatory view showing the embodiment of the method of bonding a target material and a backing plate of the present invention.

As shown in FIG. 1D, subsequently, the target material 2 is slid and moved in the first direction D1 along the principal surface 3a of the backing plate 3 so that the first edge 21 of the target material 2 is moved from the first edge 31 side of the bonding region 30 of the backing plate 3 to a position beyond the second edge 32 of the bonding region 30 of the backing plate 3.

Figure 1E:
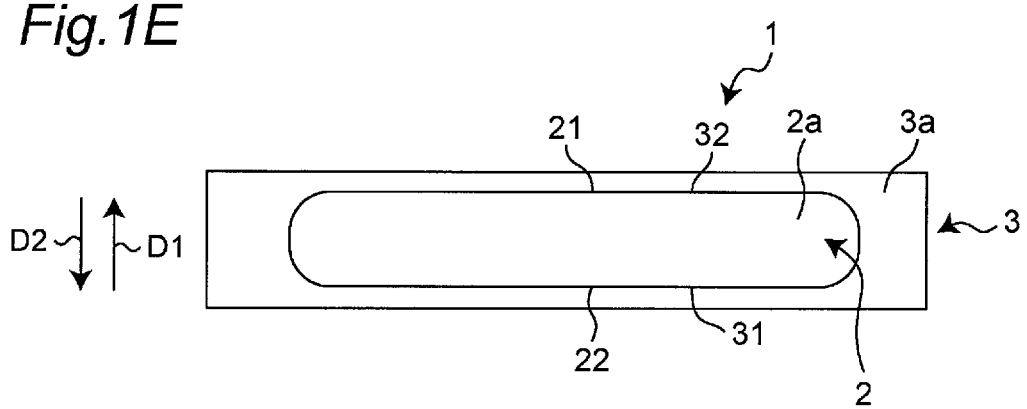
FIG. 1E is an explanatory view showing the embodiment of the method of bonding a target material and a backing plate of the present invention.

As shown in FIG. 1E, subsequently, the target material 2 is slid and moved in the second direction D2 along the principal surface 3a of the backing plate 3 to match the target material 2 with the bonding region 30 of the backing plate 3. Subsequently, the positions of the target material 2 and the backing plate 3 are precisely matched, and a bonded body of the target material 2 and the backing plate 3 is cooled while both are fixed by placing a weight or being clamped with a vise or a clamp, so as to solidify the bonding material 4. As a result, the target material 2 and the backing plate 3 are bonded by the bonding material 4 to manufacture the sputtering target 1.

According to the bonding method, the target material 2 is slid in the first direction D1 relative to the backing plate 3 and then reversed in the second direction D2 to match the target material 2 with the bonding region 30 of the backing plate 3. By not only sliding but also reversing the target material 2 in this way, the bonding material 4 can be pulled back in the second direction D2 by surface tension as the target material 2 is reversed, and a space without the bonding material 4 can be reduced between the target material 2 and the backing plate 3, so that an unbonded portion can be made smaller.

Therefore, in the bonding of the target material 2 and the backing plate 3, the bonding rate can be improved, and the maximum defect area can be reduced.

The bonding rate refers to a rate of the bonding area of the bonding portion between the target material 2 and the backing plate 3 to the area of the bonding region 30.

Specifically, the bonding area refers to a total area of portions where a region without the bonding material is not detected when viewed in a thickness direction of the bonding layer between the target material 2 and the backing plate 3.

Figure 2A:
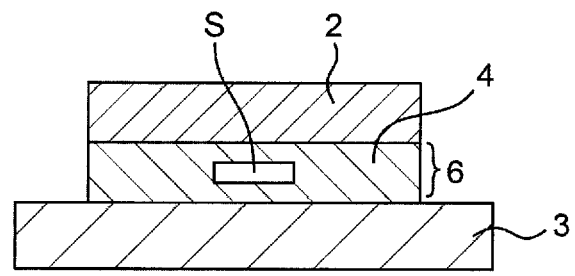
FIG. 2A is a simplified cross-sectional view showing a state without a bonding material in a bonding layer present between the target material and the backing plate.
Figure 2B:
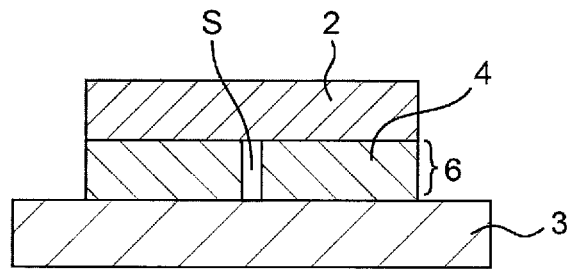
FIG. 2B is a simplified cross-sectional view showing a state without a bonding material in the bonding layer present between the target material and the backing plate.

The maximum defect area refers to an area of a portion having the largest area among the portions without the bonding material 4 located between the target material 2 and the backing plate 3. The portion without the bonding material 4 (unbonded portion) means a region, i.e., a space, where no bonding material exists, or a portion where a foreign substance other than the bonding material such as an oxide of the bonding material is detected, in the thickness direction of the bonding layer, and may include those where no bonding material exists entirely or partially in the thickness direction of the bonding layer. For example, as shown in FIG. 2A, the bonding layer 6 present between the target material 2 and the backing plate 3 may have a space S without the bonding material 4 partially in the thickness direction of the bonding layer 6 (up-down direction in the figure), or as shown in FIG. 2B, the bonding layer 6 present between the target material 2 and the backing plate 3 may have the space S without the bonding material 4 entirely in the thickness direction of the bonding layer 6 (up-down direction in the figure). The region without the bonding material can be detected by a measurement method described later. For example, in the case of using ultrasonic flaw detection measurement is used, if the bonding layer has a space without the bonding material, incident ultrasonic waves are reflected at an interface, so that a defect part can be recognized.

Therefore, according to the present invention, since the bonding rate between the target material 2 and the backing plate 3 can be increased and the maximum defect area can be reduced, a portion having low bonding strength is less likely to be formed, so that the sputtering target 1 with the target material 2 hardly peeled off can be manufactured.

As described above, in the present invention, by focusing on both the bonding rate and the maximum defect area, it was found that the target material 2 becomes hard to peel during sputtering. Specifically, regarding the bonding rate, when the bonding rate becomes larger, the region without the bonding material 4 can be reduced, and the target material 2 becomes hard to peel.

On the other hand, regarding the maximum defect area, when the maximum defect area becomes larger, a large defect locally occurs, deteriorating electrical/thermal conductivity in a corresponding portion and causing heat concentration in the corresponding portion, so that the bonding material 4 is melted, and the target material 2 is easily peeled off. Therefore, when the maximum defect area becomes smaller, no large defect occurs locally, and the target material 2 becomes hard to peel.

According to the bonding method, the target material 2 is slid and moved in the transverse direction of the backing plate 3 relative to the backing plate 3. As a result, when each of the target material 2 and the backing plate 3 has an elongated shape, a movement distance of the target material 2 can be reduced with respect to the backing plate 3, and a working time can be shortened. Additionally, employing the moving method can enhance the effects of improving the bonding rate and reducing the maximum defect area by a step of replenishing the bonding material 4 provided between steps of sliding and reversing the target material 2 described later.

Before and after a step of applying the bonding material (see FIG. 1B), spacers are preferably arranged on the principal surface 3a of the backing plate 3. A wire, spherical or rod-shaped beads, a sheet, etc. can be used as the spacer. Whether the spacer is arranged at a step before or after the application of the bonding material may be selected depending on a shape, a size, a length, and a material of the spacer. The material of the spacer may be any material having a higher melting point than the bonding material and hardly melted or deformed at a heating temperature during bonding and can be metal or alloy such as copper, aluminum, nickel, or stainless steel, or resin such as polyimide and super engineering plastic, and from the viewpoint of enhancing the electrical conductivity and thermal conductivity of the bonding layer, the spacer is preferably made of a metal or alloy material. The spacer is preferably a wire from the viewpoint of facilitating the movement of the target material such as slide and reverse, and from the viewpoint of facilitating uniform thickness of the bonding layer of the sputtering target, particularly, a large-sized sputtering target.

The wire is preferably disposed such that both ends of the wire are outside the bonding region on the backing plate, and more preferably, multiple wires are arranged. The direction of disposition of the wire is preferably a direction parallel to the direction of sliding or reversing the target material. As a result, the wire does not hinder the movement of the bonding material occurring when the target material is moved, and as a result, the bonding rate of the sputtering target can be increased to reduce the maximum defect area.

Preferably, multiple wires 5 are arranged on the principal surface 3a of the backing plate 3 as shown in FIG. 1A before the step of applying the bonding material 4 (see FIG. 1B). The material of the wires 5 is stainless steel or copper, for example. Specifically, the wires 5 are arranged to extend in the first direction D1 in the bonding region 30, and the multiple wires 5 are arranged at intervals in a direction orthogonal to the first direction D1. When the target material 2 is moved in the first direction D1 and the second direction D2, the target material 2 is slid and moved on the wires 5. As a result, since the target material 2 is slid on the wires 5, the target material 2 can easily be moved. The number of the wires 5 to be arranged is not particularly limited as long as the target material 2 can be moved parallel and is preferably 5 or more, more preferably 7 or more, and further preferably 9 or more. Furthermore, since the wires 5 serve as the spacer, the thickness of the bonding layer formed of the bonding material 4 can be made constant. An average thickness of the bonding layer is usually 0.03 mm or more and 1.5 mm or less, preferably 0.05 mm or more and 1 mm or less, more preferably 0.08 mm or more and 0.5 mm or less, further preferably 0.1 mm or more and 0.35 mm or less. A difference between the maximum thickness and the minimum thickness of the bonding layer is preferably 0.5 mm or less, more preferably 0.4 mm or less, further preferably 0.3 mm or less, and particularly preferably 0.25 mm or less. A variation (uniformity) in thickness of the bonding layer is 50% or less, and the variation in thickness of the bonding layer can be obtained from an equation: (tmax−tmin)/(tmax+tmin)×100 (%) based on a maximum value (tmax) and a minimum value (tmin) of a thickness t (mm) of the bonding layer measured at any multiple points in the thickness direction of the sputtering target. The variation in thickness of the bonding layer is preferably 50% or less, more preferably 45% or less, further preferably 40% or less, still further preferably 35% or less. The average thickness of the bonding layer, the difference between the maximum thickness and the minimum thickness of the bonding layer, and the variation in thickness of the bonding layer can be calculated by measuring the thickness of the bonding layer at any multiple points (preferably four points or more) around the bonding layer of the sputtering target 1. The thickness of the bonding layer is obtained by measuring the bonding layer from the side with, for example, a ruler, a caliper, or a depth gauge. The numerical value of the difference between the maximum thickness and the minimum thickness indicates substantially the same numerical value as the difference between the maximum thickness and the minimum thickness of the height from a reference surface (e.g., the bonding surface of the backing plate) of the surface of the target material 2 in the sputtering target 1 when the sputtering target 1 is not warped, and therefore, the numerical value can be obtained by measuring the height at any multiple points of the target material 2 in the sputtering target 1 with a height gauge, for example. When the bonding rate of the sputtering target 1 is improved, and the size of the maximum defect area having the largest area among the unbonded portions is reduced, the sputtering target with the target material more hardly peeled off can be achieved by further reducing the variation in thickness of the bonding layer.

The diameter of the wires 5 is preferably 0.05 mm or more and 0.5 mm or less, more preferably 0.1 mm or more and 0.3 mm or less. As a result, the wires 5 are hardly broken, and the variation in thickness of the bonding layer can be reduced.

Preferably, between a step of moving the target material 2 in the first direction D1 (see FIG. 1D) and a step of moving the target material 2 in the second direction D2 (see FIG. 1E), the bonding material 4 is replenished on the first edge 31 side of the bonding region 30 of the backing plate 3. Specifically, in the state shown in FIG. 1D, the bonding material 4 is added to a portion of the bonding region 30 not covered with the target material 2. As a result, since the bonding material 4 is replenished on the first edge 31 side of the bonding region 30 of the backing plate 3, the bonding material 4 can be replenished on the first edge 31 side of the bonding region 30 where the bonding material 4 is likely to be insufficient as the target material 2 moves, so that the bonding rate can further be improved, and the maximum defect area can further be reduced. An amount of the bonding material 4 to be replenished is preferably $0.5 \times 10^{-6}$ kg/mm$^2$ or more, more preferably $0.8 \times 10^{-6}$ kg/mm$^2$ or more, further preferably $1.0 \times 10^{-6}$ kg/mm$^2$ or more. Although the upper limit is not particularly limited, the amount is preferably $20 \times 10^{-6}$ kg/mm$^2$ or less, more preferably $10 \times 10^{-6}$ kg/mm$^2$ or less, further preferably $7.0 \times 10^{-6}$ kg/mm$^2$ or less from the viewpoint of workability of the bonding step.

Preferably, when the first edge 21 of the target material 2 is moved to a position beyond the second edge 32 of the bonding region 30 of the backing plate 3 as shown in FIG. 1D at the step of moving the target material 2 in the first direction D1, and it is assumed that A is a distance in the first direction D1 from the second edge 32 of the bonding region 30 of the backing plate 3 to the first edge 21 of the target material 2 and that W is a width of the bonding region 30 in the first direction D1, 0.03≤A/W<1.0, preferably 0.05≤A/W≤0.8, and more preferably 0.06≤A/W≤0.6 are satisfied. Specifically, 10 mm≤A≤150 mm, preferably 12 mm≤A≤120 mm, and preferably 150 mm≤W≤300 mm are satisfied. As a result, the bonding rate can be improved, and the maximum defect area can be reduced while shortening the movement distance of the target material 2 with respect to the backing plate 3.

Preferably, when the first edge 21 of the target material 2 is arranged on the first edge 31 side of the bonding region 30 of the backing plate 3 as shown in FIG. 1C at the step of moving the target material 2 in the first direction D1, and it is assumed that B is a distance in the first direction D1 from the first edge 31 of the bonding region 30 of the backing plate 3 to the first edge 21 of the target material 2 and that W is a width of the bonding region 30 in the first direction D1, a lower limit value of B/W is 0 or more, preferably 0.03 or more, more preferably 0.10 or more, further preferably 0.20 or more, and an upper limit of B/W is less than 2.0, preferably 1.5 or less, more preferably 1.2 or less, further preferably 1.0 or less, and particularly preferably 0.8 or less. Specifically, 0 mm≤B≤300 mm, preferably 5 mm≤B≤200 mm, and preferably 150 mm≤W≤300 mm are satisfied. As a result, the bonding rate can be improved, and the maximum defect area can be reduced while shortening the movement distance of the target material 2 with respect to the backing plate 3.

The speed of movement (slide) in the first direction D1 and movement (reverse) in the second direction D2 of the target material 2 is preferably 100 mm/sec or less, more preferably 50 mm/sec or less, further preferably 30 mm/sec or less, from the viewpoint of preventing extra movement and runout of the bonding material placed in the bonding region. Although the lower limit is not particularly limited, the speed is 1 mm/sec or more, preferably 5 mm/sec or more, from the viewpoint of productivity.

At the stage where the edge of the target material 2 is arranged on the first edge side of the bonding region of the backing plate, and/or the stage where the movement (slide) of the target material 2 in the first direction D1 is completed, a step of removing air possibly present in the bonding layer by applying vibration from the upper surface of the bonding layer is preferably provided. For means of applying vibration, a technique of lightly tapping the upper surface of the target material or a method of applying vibration in a direction parallel to the upper surface of the target material 2 can be performed. Regarding a range of application of the vibration, preferably, the application is performed to the entire bonding layer between the target material and the backing plate (the bonding region on which the target material is placed) at the stage where the edge of the target material 2 is arranged on the first edge side of the bonding region of the backing plate, and the application is performed to a leading part of the movement (reverse) operation in the second direction D2 at the stage where the movement (slide) of the target material 2 in the first direction D1 is completed. The vibration is preferably applied from the center of the bonding layer between the target material and the backing plate (the bonding region on which the target material is placed) toward the outer circumference. As a result, the air present in the bonding layer can be released, so that the bonding rate can be improved, and the maximum defect area can be reduced. Particular, at the stage where the edge of the target material 2 is arranged on the first edge side of the bonding region of the backing plate, an air pool is highly likely to exist in the bonding layer between the target material and the backing plate (the bonding region on which the target material is placed), and therefore, the effect of improving the bonding rate and reducing the maximum defect area can further be achieved by providing the air removal step.

Figure 4A:
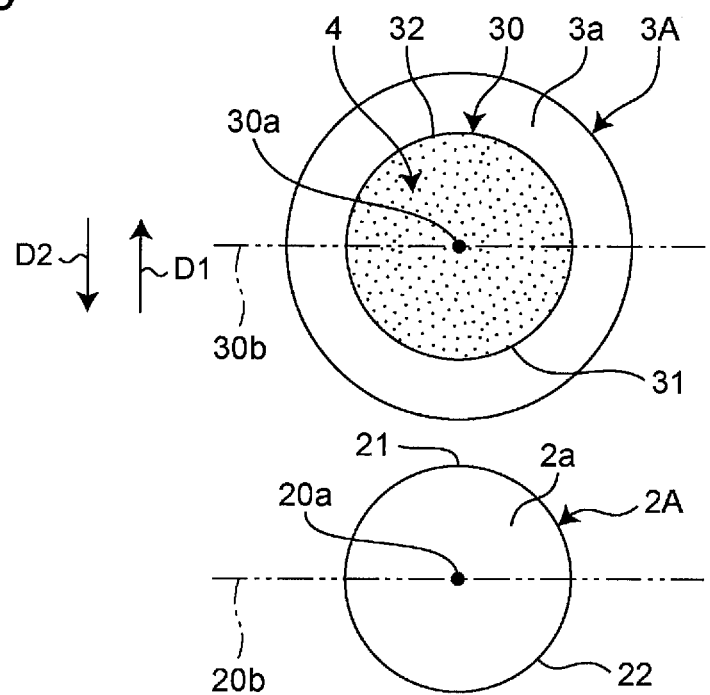
FIG. 4A is an explanatory view showing an embodiment of a method of bonding a target material and a backing plate of the present invention.

In another embodiment, as shown in FIG. 4A, a target material 2A has a circular plate shape, and in this case, a backing plate 3A may also have a circular shape. The diameter of the target material 2A is, for example, 210 mm or more, preferably 220 mm or more, more preferably 240 mm or more, further preferably 275 mm or more, and preferably 500 mm or less, more preferably 450 mm or less, further preferably 400 mm or less, particularly preferably 350 mm or less. When the target material 2A has a circular plate shape, an area of a surface perpendicular to the thickness direction of the target material 2A (i.e., the sputtering surface 2a, or a surface on the back side of the sputtering surface 2a) is 13000 mm$^2$ or more, preferably 15000 mm$^2$ or more, more preferably 35000 mm$^2$ or more, further preferably 45000 mm$^2$ or more, still further preferably 60000 mm$^2$ or more, particularly preferably 70000 mm$^2$ or more, and 400000 mm$^2$ or less, preferably 300000 mm$^2$ or less, more preferably 275000 mm$^2$ or less, further preferably 200000 mm$^2$ or less, still further preferably 150000 mm$^2$ or less, particularly preferably 100000 mm$^2$ or less. The thickness of the target material 2A is, for example, 3 mm or more and 40 mm or less, preferably 4 mm or more and 30 mm or less, more preferably 5 mm or more and 25 mm or less, and further preferably 10 mm or more and 20 mm or less. In the present invention, even when a large circular target material is used, an improvement in the bonding rate and a reduction in the maximum defect area in the entire bonding region can be implemented.

Even when the target material 2A is circular, the material described above can be employed as the material used for producing the target material 2A. The backing plate 3A is formed in a circular plate shape, and the diameter of the backing plate 3A is preferably 250 mm or more and 600 mm or less, more preferably 275 mm or more and 550 mm or less, further preferably 300 mm or more and 500 mm or less, still further preferably 320 mm or more and 450 mm or less.

When the target material 2A is circular, the backing plate 3A has the circular bonding region 30 (indicated by hatching) on the principal surface 3a of the upper surface. The bonding region 30 is a region to which the target material 2A should be bonded. The shape of the bonding region 30 corresponds to the shape of the target material 2A. Therefore, although the size of the bonding region 30 may be smaller than the size of the bonding surface of the target material 2A, the size is substantially the same as the size of the bonding surface of the target material 2A, preferably the size of the target material 2A. When the target material 2A is formed in a circular plate shape, the area of the bonding region 30 is 13000 mm$^2$ or more, preferably 15000 mm$^2$ or more, more preferably 35000 mm$^2$ or more, further preferably 45000 mm$^2$ or more, still further preferably 60000 mm$^2$ or more, particularly preferably 70000 mm$^2$ or more, and 400000 mm$^2$ or less, preferably 300000 mm$^2$ or less, more preferably 275000 mm$^2$ or less, further preferably 200000 mm$^2$ or less, still further preferably 150000 mm$^2$ or less, and particularly preferably 100000 mm$^2$ or less.

A method of bonding the circular target material 2A and the circular backing plate 3A will be described.

As shown in FIG. 4A, the bonding region 30 of the backing plate 3A is circular. When viewed in a direction orthogonal to the principal surface 3a of the backing plate 3A, the first edge 31 corresponds to a semicircular arc on the second direction D2 side relative to a reference line 30b orthogonal to the first direction D1 and passing through a center 30a of the bonding region 30, and the second edge 32 corresponds to a semicircular arc on the first direction D1 side relative to the reference line 30b. The second edge 32 is located in the first direction D1 from the first edge 31.

When viewed in a direction orthogonal to the sputtering surface 2a of the target material 2A, the first edge 21 corresponds to a semicircular arc on the first direction D1 side relative to a reference line 20b orthogonal to the first direction D1 and passing through a center 20a of the sputtering surface 2a, and the second edge 22 corresponds to a semicircular arc on the second direction D2 side relative to the reference line 20b. The second edge 22 is located in the second direction D2 from the first edge 21.

Figure 4B:
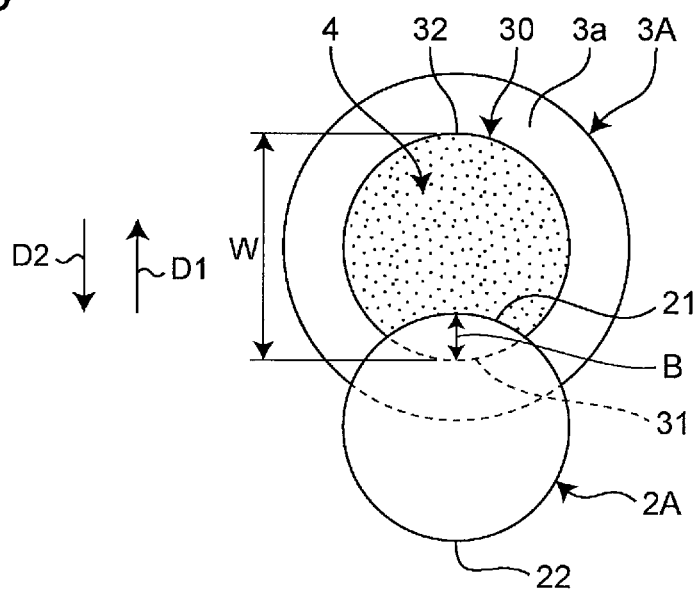
FIG. 4B is an explanatory view showing the embodiment of the method of bonding a target material and a backing plate of the present invention.

First, as shown in FIG. 4A, the bonding material 4 is applied to the entire surface of the bonding region 30 of the backing plate 3A. Subsequently, as shown in FIG. 4B, the first edge 21 of the target material 2A is placed on the first edge 31 side of the bonding region 30 of the backing plate 3A. In this case, preferably, the first edge 21 of the target material 2A is arranged to overlap the bonding region 30.

Figure 4C:
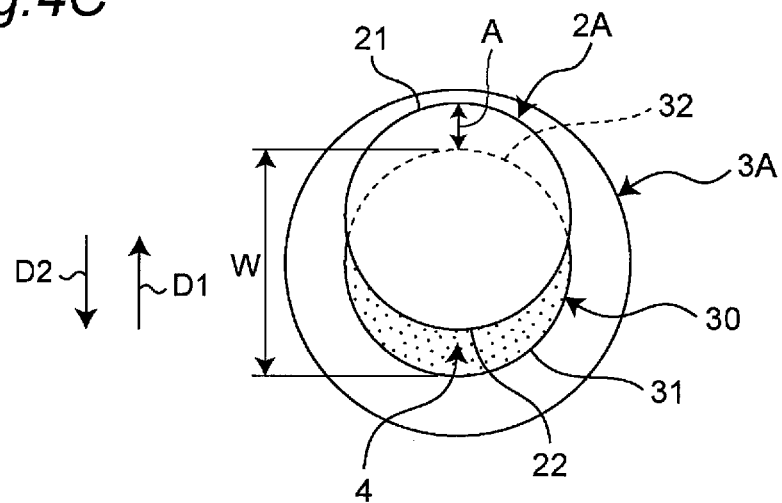
FIG. 4C is an explanatory view showing the embodiment of the method of bonding a target material and a backing plate of the present invention.

As shown in FIG. 4C, the target material 2A is slid and moved in the first direction D1 along the principal surface 3a of the backing plate 3A so that the first edge 21 of the target material 2A is moved from the first edge 31 side of the bonding region 30 of the backing plate 3A to a position beyond the second edge 32 of the bonding region 30 of the backing plate 3A.

Figure 4D:
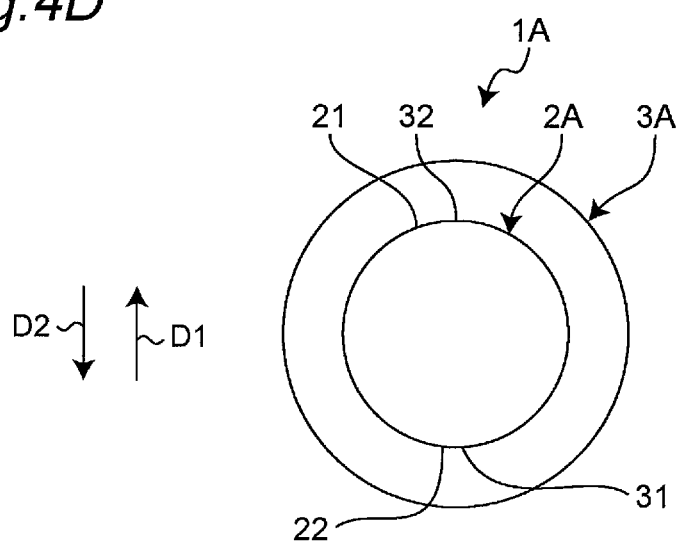
FIG. 4D is an explanatory view showing the embodiment of the method of bonding a target material and a backing plate of the present invention.

Subsequently, as shown in FIG. 4D, the target material 2A is slid and moved in the second direction D2 along the principal surface 3a of the backing plate 3A to match the target material 2A with the bonding region 30 of the backing plate 3. Subsequently, the positions of the target material 2A and the backing plate 3A are precisely matched, and a bonded body of the target material 2A and the backing plate 3A is cooled while both are fixed by placing a weight or being clamped with a vise or a clamp, so as to solidify the bonding material 4. As a result, the target material 2A and the backing plate 3A are bonded by the bonding material 4 to manufacture the sputtering target 1A.

Preferably, when the first edge 21 of the target material 2A is moved to a position beyond the second edge 32 of the bonding region 30 of the backing plate 3A as shown in FIG. 4C at the step of moving the target material 2A in the first direction D1, and it is assumed that A is a distance in the first direction D1 from the second edge 32 of the bonding region 30 of the backing plate 3A to the first edge 21 of the target material 2A and that W is a width of the bonding region 30 in the first direction D1, $0.03 \leq A/W < 1.0$, preferably $0.05 \leq A/W \leq 0.8$, and more preferably $0.06 \leq A/W \leq 0.6$ are satisfied.

The distance A refers to a maximum value of a distance in the first direction D1 between the second edge 32 and the first edge 21. The width W refers to the diameter of the bonding region 30. Specifically, $10 \text{ mm} \leq A \leq 150 \text{ mm}$, preferably $12 \text{ mm} \leq A \leq 120 \text{ mm}$, and $210 \text{ mm} \leq W \leq 500 \text{ mm}$, preferably $275 \text{ mm} \leq W \leq 350 \text{ mm}$ are satisfied. As a result, the bonding rate can be improved, and the maximum defect area can be reduced while shortening the movement distance of the target material 2A with respect to the backing plate 3A.

Preferably, when the first edge 21 of the target material 2A is arranged on the first edge 31 side of the bonding region 30 of the backing plate 3A as shown in FIG. 4B at the step of moving the target material 2A in the first direction D1, and it is assumed that B is a distance in the first direction D1 from the first edge 31 of the bonding region 30 of the backing plate 3A to the first edge 21 of the target material 2A and that W is a width of the bonding region 30 in the first direction D1, a lower limit value of B/W is 0 or more, preferably 0.02 or more, more preferably 0.05 or more, further preferably 0.10 or more, particularly preferably 0.20 or more, and an upper limit of B/W is less than 2.0, preferably 1.5 or less, more preferably 1.2 or less, further preferably 1.0 or less, and particularly preferably 0.8 or less.

The distance B refers to a maximum value of a distance in the first direction D1 between the first edge 31 and the first edge 21. The width W refers to the diameter of the bonding region 30.

Specifically, 0 mm≤B≤500 mm, preferably 5 mm≤B≤300 mm, more preferably 7.5 mm≤B≤200 mm, 210 mm≤W≤500 mm or less, preferably 275 mm≤W≤350 mm are satisfied. As a result, the bonding rate can be improved, and the maximum defect area can be reduced while shortening the movement distance of the target material 2A with respect to the backing plate 3A.

A method of manufacturing the sputtering target 1 will be described. As described above, the target material and the backing plate are bonded by using the bonding method to manufacture a sputtering target.

In the manufacturing method of the present invention, the target material may be processed into a substantially plate shape, and the method of processing into a plate shape is not particularly limited. For the target material made from a metal material, for example, a rectangular parallelepiped, cylindrical, or columnar target material obtained by melting and casting can be subjected to plastic working such as rolling, extruding, and forging, and then subjected to machining such as cutting, grinding, and polishing (cutting processing, milling, end milling, etc.) to produce the target material having a desired size and surface condition. The rolling is described in Japanese Laid-Open Patent Publication No. 2010-132942 and WO 2011/034127, for example. The extruding is described in Japanese Laid-Open Patent Publication No. 2008-156694, for example. The forging is described in Japanese Laid-Open Patent Publication Nos. 2017-150015 and 2001-240949 or The Handbook of Advanced Aluminum Technology (edited by Editorial Committee of the Handbook of Advanced Aluminum Technology, Japan Institute of Light Metals; Kallos Publishing; New Edition; published on Nov. 18, 1996), for example. The machined plate-shaped target material is bonded to the backing plate by using the bonding method of the present invention to manufacture the sputtering target. For the target material, a target material machined to predetermined dimensions may be purchased, or the target material may be obtained by removing the backing plate from the sputtering target having deviated from product specifications due to abnormality in bonding to the backing plate in a manufacturing step of the sputtering target 1 and further removing the bonding material. If necessary, the surface of the sputtering target after bonding may be subjected to finishing processing by cutting or polishing.

Since the bonding method of the present invention is used in the method of manufacturing a sputtering target of the present invention, the sputtering target improved in quality can be obtained.

The sputtering target 1 bonded by the bonding method will be described.

As shown in FIG. 1E, the sputtering target 1 has the backing plate 3 and the target material 2 bonded via the bonding material 4 to the bonding region 30 of the backing plate 3.

Figure 3A:
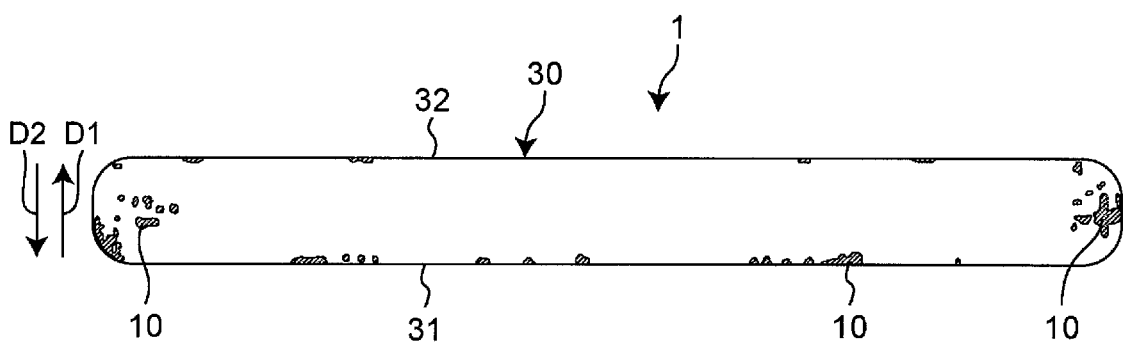
FIG. 3A is a simplified view showing a state of the bonding material between the target material and the backing plate of the sputtering target of the present invention.

FIG. 3A is a simplified view showing a state of the bonding material 4 between the target material 2 and the backing plate 3 of the sputtering target 1. In FIG. 3A, defect portions (unbonded portions) 10 without the bonding material 4 in the bonding region 30 are indicated by hatching. The defect portions 10 can be measured by using, for example, ultrasonic flaw detection measurement or transmission type X-ray observation and, when the area of the bonding region is large, the ultrasonic flaw detection measurement is preferably used. Usable ultrasonic flaw detecting devices include FS LINE or FS LINE Hybrid manufactured by Hitachi Power Solutions Co., Ltd., a phased array ultrasonic flaw detection imaging device PDS and an ultrasonic flaw detection imaging device ADS71000 manufactured by KJTD Co., Ltd., etc. When the bonding rate and the maximum defect area are obtained by ultrasonic flaw detection measurement, ultrasonic flaw detection measurement conditions for recognizing a reflected wave from a defect part must be adjusted by using a pseudo-defect sample provided with a flat bottom hole having a predetermined size. Since the propagation speed of ultrasonic wave differs depending on a material, the pseudo-defect sample is preferably made of the same material as the material on the ultrasonic wave incident side of the sputtering target 1 so as to achieve the same measurement sensitivity and conditions. Additionally, it is preferable that a distance from an ultrasonic wave incident surface to a bottom surface of the flat bottom hole in the pseudo-defect sample is equal to the distance from an ultrasonic wave incident surface of the sputtering target 1 to the bonding layer.

As shown in FIG. 3A, the portion without the defect portions 10 detected between the target material 2 and the backing plate 3 has an area accounting for 97% or more of the area of the bonding region 30. Therefore, the bonding rate is 97% or more, preferably 98% or more, more preferably 98.5% or more. The maximum defect area of the defect portions 10 in the bonding layer between the target material 2 and the backing plate 3 accounts for 2% or less, preferably 1% or less, more preferably 0.6% or less, further preferably 0.3% or less, still further preferably 0.1% or less, particularly preferably less than 0.05%, of the area of the bonding region 30. For example, when the area of the bonding region 30 is 200 mm×2300 mm, the maximum defect area is 2000 mm$^2$ or less.

According to the present invention, the bonding rate can be improved, and the maximum defect area can be reduced, so that the sputtering target 1 with the target material 2 hardly peeled off can be manufactured. Preferably, the area of the bonding surface of the target material 2 is 13000 mm$^2$ or more, Preferably, the length of the target material 2 is 1000 mm or more and 4000 mm or less, and the sputtering target 1 with the target material 2 hardly peeled off can be manufactured even when the sputtering target 1 is large-sized and/or elongated.

Although the maximum upper limit of the bonding rate is 100%, the bonding rate is preferably 99.99% or less, more preferably 99.95% or less, further preferably 99.90% or less, from the viewpoint that the target material can easily be peeled off when the backing plate is removed from the sputtering target having deviated from product specifications due to abnormality during bonding or the sputtering target already used for sputtering. The target material can be peeled off from the sputtering target by applying heat to the sputtering target to a temperature equal to or higher than the melting point of the bonding material used for bonding to soften or melt the bonding layer and physically destroying the bonding layer as needed.

The lower limit of the proportion of the maximum defect area to the area of the bonding region 30 is not particularly limited, the proportion is 0.001% or more, preferably 0.003%, more preferably 0.005% or more, further preferably 0.008% or more from the viewpoint of further suppressing the warp of the sputtering target due to heat generated during sputtering. When the lower limit of the proportion of the maximum defect area is equal to or greater than the proportion described above, a deformation of the target material caused by the heat during sputtering is alleviated by a local defect part, and the warp of the sputtering target is reduced.

Figure 3B:
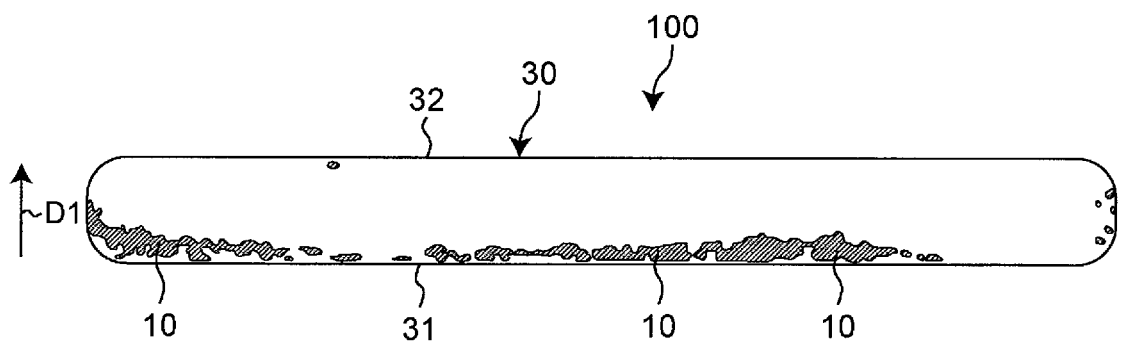
FIG. 3B is a simplified view showing a state of the bonding material between the target material and the backing plate of the sputtering target of a comparative example.

On the other hand, FIG. 3B shows a sputtering target 100 of a comparative example when the target material and the backing plate are bonded only by sliding the target material in the first direction D1 and shows a state of the bonding material between the target material and the backing plate. As shown in FIG. 3B, as compared to FIG. 3A, the proportion of the defect portions 10 is large so that the bonding rate is small, and the maximum defect area of the defect portions 10 is large. In this way, when the target material is only slid, the bonding state between the target material and the backing plate becomes poor, and as a result, the target material is easily peeled off. Particularly, when the sputtering target has a long target material or a large bonding region, the target material is notably easily peeled off.

In a preferred embodiment of the sputtering target of the present invention, wires may be included between the target material and the backing plate, i.e., in the bonding layer. The wires are preferably arranged at equal intervals in a direction parallel to the direction in which the target material 2 is slid. For example, when the target material 2 has an elongated plate shape, the multiple wires are preferably arranged at intervals in a direction orthogonal to the longitudinal direction of the target material 2, and more preferably, the wires are arranged at equal intervals. A ratio of the number of the wires disposed in the bonding layer to the length of the target material 2 to the longitudinal direction (the number of wires/the length (mm) of the target material 2) is 0.002 or more and 0.008 or less, preferably 0.003 or more and 0.007 or less, more preferably 0.003 or more and 0.006 or less. Since including the wires in the bonding layer as described above makes it easy to ensure the thickness of the bonding layer and to make the thickness of the bonding layer more constant, the bonding rate of the sputtering target 1 can be made larger and the maximum defect area can be made smaller, so that the sputtering target 1 with the target material 2 hardly peeled off can be manufactured.

EXAMPLE 1

A rolled plate made of high-purity Al having a purity of 99.999% was prepared and subjected to cutting with a double column type machining center to produce a target material of 200 mm×2300 mm×t16 mm (the area of the bonding surface is $4.5 \times 10^5$ mm$^2$, which is the same as size of the area of the bonding region), and a backing plate made of oxygen-free copper having a purity of 99.99% was prepared. The width (so-called target material width) W of the bonding region in the first direction D1 at the step of moving the target material was 200 mm.

The target material and the backing plate were heated on a hot plate to a temperature equal to or higher than the melting point of the bonding material.

The Sn—Zn—In alloy material was melted on the bonding surface of the target material, and the In material was melted on the bonding surface of the backing plate, then metallizing processing was performed on the bonding surfaces of both materials by using an ultrasonic soldering iron. After the metallizing processing, oxides of the Sn—Zn—In alloy material and the In material and the excess Sn—Zn—In alloy material and In material on the bonding surface of the target material and the bonding surface of the backing plate were removed with a spatula.

Ten SUS wires with a diameter of 0.2 mm are arranged at approximately equal intervals on the bonding surface of the backing plate subjected to the metallizing processing in a direction perpendicular to the longitudinal direction of the backing plate, and an In material for bonding was further applied onto the bonding surface from above the SUS wires. The amount of the In material for bonding applied from above the SUS wires onto the bonding surface was 7.80 kg.

The direction of the target material was changed so that the bonding surface of the target material faced parallel to the bonding surface of the backing plate, and the target material was placed on the wires so that one side on the long side of the target material was overlapped with one side on the long side of the backing plate (a target material placement position B=0) and was slid in the direction of a predetermined bonding position. The target material was slid so that a ratio A/W of a distance (overrun amount) A of overrun of the target material from the predetermined bonding position to the width W of the target material is 0.1625, and the leading part in the movement (reverse) direction of the second direction D2 of the target material was lightly tapped from above to expel air.

Subsequently, the target material was slid to a predetermined bonding position. After the position of the target material was finely adjusted so that the target material is located at the predetermined bonding position, and a weight was placed on the target material to fix the target material and the backing plate, the bonding body was cooled to produce the sputtering target. Regarding the bonding layer of the sputtering target, when the thickness of the bonding layer was measured at a total of six positions at both ends on the long sides and a central part with a caliper to obtain a difference between the maximum value and the minimum value of the thickness of the bonding layer, the difference was 0.2 mm. The variation in thickness of the bonding layer obtained from the thickness of the bonding layer measured at six locations was 33%.

The variation in thickness of the bonding layer can be obtained from the equation: $(t_{max} - t_{min})/(t_{max} + t_{min}) \times 100$ (%) based on the maximum value ($t_{max}$) and the minimum value ($t_{min}$) of the thickness t (mm) of the measured bonding layer.

After the In material is solidified, the warp occurring due to a difference in linear expansion coefficient between the target material and the backing plate was corrected to obtain the sputtering target. The bonding rate and the maximum defect area were measured with the ultrasonic flaw detecting device FS-LINE manufactured by Hitachi Power Solutions, Ltd.

The bonding rate and the maximum defect area were measured with the following procedure. First, a rolled plate made of high-purity Al having a purity of 99.999% was used to prepare a pseudo-defect sample by cutting both surfaces of the rolled plate to form parallel surfaces and then making a flat-bottomed hole and a counterbore having a circle-equivalent diameter (diameter) ø of 2 mm and 6 mm, respectively, from a surface on one side. At this step, a distance from the sample surface without the holes to the flat-bottomed hole was made equal to the thickness of the target material.

For preparation before measurement, an ultrasonic flaw detector "I3-1006-T S-80 mm" (frequency: 10 MHz, focal length: 80 mm) was attached to the measurement device.

The pseudo-defect sample was set in the measurement device, and the counterbore was brought into focus to start the measurement. First, the counterbore was confirmed, and the flat-bottomed hole was then confirmed while the counterbore is in focus. Subsequently, the flat-bottomed hole was brought into focus. In this state, ultrasonic flaw detection (C scan) was performed and, as a result of sensitivity adjustment making the detected flat-bottomed hole diameter equal to the flat-bottomed hole diameter of the pseudo-defect sample, the measurement conditions were set to a gain (sound wave intensity) of 12 dB, a measurement pitch of 2 mm, and a defect level of 38. Therefore, a sensitivity of a program was adjusted so that a reflected echo having an intensity of 38 or more was detected as a defect.

The pseudo-defect sample was taken out from the measurement device, and the bonded sputtering target was set in the measurement device so that the target material side serves as the upper surface. After setting an ultrasonic flaw detector height such that a focal position height of the program created with the pseudo-defect sample is on the bonding layer of the sputtering target and an ultrasonic flaw detector scanning range such that a measurement field of view is the entire bonding surface, the ultrasonic flaw detection measurement (C scan) was performed for the bonded sputtering target. Ultrasonic waves were made incident on the target material side.

Obtained data was analyzed by an analysis program associated with the ultrasonic flaw detector to obtain the bonding rate and maximum defect area information. Subsequently, the surface was finished by polishing and blasting.

Table 1 shows results of the sputtering target bonded as in Example 1.

EXAMPLES 2 to 12

Examples 2 to 12 were implemented as in Example 1 except that amounts of bonding material, wire diameters, bonding material types, target material placement positions B and overrun amounts A shown in Table 1 are used and that after the target material is placed on the bonding surface of the backing plate, substantially the entire surface of the bonding layer between the target material and the backing plate (a contact part, the bonding region with the target material placed thereon) was lightly tapped from above to remove air in the bonding layer. In Examples 2 to 12, the target material was slid in the first direction and then reversed in the second direction as in Example 1. The difference between the maximum value and the minimum value of the thickness of the bonding layer of the sputtering target obtained as in Example 1 was 0.2 to 0.4 mm. The variation in thickness of the bonding layer was 28 to 40%.

EXAMPLE 13

In Example 13, except that the bonding surface of the backing plate was metallized with an Sn—Zn material, that an Sn—Zn (containing 9% Zn) was used as the bonding material, and that air in the bonding layer was not expelled, a sputtering target was produced as in Example 2 to obtain the bonding rate and the maximum defect area.

EXAMPLE 14

A rolled plate made of Al alloy containing 0.5 wt % Cu was prepared and subjected to cutting with an NC lathe to produce a target material of ø300 mm×t8 mm (the area of the bonding surface is $7.1 \times 10^4$ mm$^2$, which is the same as the size of the area of the bonding region), and a backing plate made of oxygen-free copper having a purity of 99.99% was prepared. The width (so-called target material diameter) W of the bonding region in the first direction D1 at the step of moving the target material was 300 mm.

A sputtering target was produced as in Example 1 under the conditions of the placed bonding material amount of 1.23 kg (In), no bonding material replenishment, the wire diameter of 0.2 mm (SUS), the target material placement position B of 10 mm (B/W is 0.03), the overrun amount A of 32.5 mm (A/W is 0.1083), and the air in the bonding layer expelled. Two wires were used and arranged parallel to the sliding direction of the target material at positions of ¼ and ¾ of the diameter of the target material.

In Example 14, the target material was slid in the first direction and then reversed in the second direction as in Example 1. The bonding rate obtained as in Example 1 was 99.32%, the maximum defect area was 178 mm$^2$, and the proportion of the maximum defect area to the area of the bonding region was 0.25%. Regarding the bonding layer of the sputtering target, when the thickness of the bonding layer was measured at a total of six positions at equal intervals with a caliper to obtain a difference between the maximum value and the minimum value of the thickness of the bonding layer, the difference was 0.2 mm. The variation in thickness of the bonding layer obtained from the thickness of the bonding layer measured at six locations was 32%.

Comparative Example 1

Comparative Example 1 was implemented as in Examples 2 to 12 except that the target material was only slid in the first direction and not reversed in the second direction.

The difference between the maximum value and the minimum value of the thickness of the bonding layer of the sputtering target obtained as in Example 1 was 0.5 mm. The variation in thickness of the bonding layer was 50%.

Comparative Example 2

In Comparative Example 2, the target material was not slid or reversed, the air was not expelled, and a sputtering target was produced under the conditions described in Table 1 without sliding or reversing the target material.

TABLE 1

| | PLACED BONDING MATERIAL AMOUNT [kg] | REPLENISHED BONDING MATERIAL AMOUNT [kg] | WIRE TYPE | WIRE DIAMETER [mm] | BONDING MATERIAL TYPE | TARGET MATERIAL PLACEMENT POSITION B [mm] | B/W |
|---|---|---|---|---|---|---|---|
| EXAMPLE 1 | 7.80 | 0 | SUS | 0.2 | In | 0 | 0 |
| EXAMPLE 2 | 7.84 | 0 | SUS | 0.2 | In | 10 | 0.05 |
| EXAMPLE 3 | 7.94 | 0.52 | SUS | 0.2 | In | 10 | 0.05 |

TABLE 1-continued

| | | | | | | | |
|---|---|---|---|---|---|---|---|
| EXAMPLE 4 | 6.70 | 2.40 | SUS | 0.2 | In | 10 | 0.05 |
| EXAMPLE 5 | 7.62 | 1.50 | SUS | 0.2 | In | 10 | 0.05 |
| EXAMPLE 6 | 7.88 | 1.78 | SUS | 0.2 | In | 10 | 0.05 |
| EXAMPLE 7 | 8.32 | 2.00 | SUS | 0.2 | In | 10 | 0.05 |
| EXAMPLE 8 | 8.12 | 0.62 | SUS | 0.2 | In | 50 | 0.25 |
| EXAMPLE 9 | 8.12 | 0.42 | SUS | 0.2 | In | 100 | 0.5 |
| EXAMPLE 10 | 7.04 | 1.12 | SUS | 0.2 | In | 150 | 0.75 |
| EXAMPLE 11 | 7.20 | 0 | SUS | 0.1 | In | 10 | 0.05 |
| EXAMPLE 12 | 8.42 | 0 | SUS | 0.3 | In | 10 | 0.05 |
| EXAMPLE 13 | 7.56 | 0 | SUS | 0.2 | Sn-Zn | 10 | 0.05 |
| EXAMPLE 14 | 1.23 | 0 | SUS | 0.2 | In | 10 | 0.03 |
| COMPARATIVE EXAMPLE 1 | 8.00 | 0 | SUS | 0.2 | In | 10 | 0.05 |
| COMPARATIVE EXAMPLE 2 | 8.64 | 0 | SUS | 0.2 | In | 200 | 1 |

| | REMOVAL OF AIR | TARGET MATERIAL OVERRUN AMOUNT A [mm] | A/W | BONDING RATE [%] | MAXIMUM DEFECT AREA [mm$^2$] | MAXIMUM DEFECT AREA/AREA OF BONDING REGION |
|---|---|---|---|---|---|---|
| EXAMPLE 1 | YES | 32.5 | 0.1625 | 98.31 | 1989 | 0.44% |
| EXAMPLE 2 | YES | 32.5 | 0.1625 | 98.80 | 1584 | 0.35% |
| EXAMPLE 3 | YES | 32.5 | 0.1625 | 99.09 | 1380 | 0.31% |
| EXAMPLE 4 | YES | 32.5 | 0.1625 | 99.66 | 400 | 0.09% |
| EXAMPLE 5 | YES | 15 | 0.075 | 99.11 | 524 | 0.12% |
| EXAMPLE 6 | YES | 50 | 0.25 | 99.18 | 580 | 0.13% |
| EXAMPLE 7 | YES | 100 | 0.5 | 99.62 | 384 | 0.09% |
| EXAMPLE 8 | YES | 32.5 | 0.1625 | 99.65 | 164 | 0.04% |
| EXAMPLE 9 | YES | 32.5 | 0.1625 | 99.88 | 48 | 0.01% |
| EXAMPLE 10 | YES | 32.5 | 0.1625 | 99.08 | 108 | 0.02% |
| EXAMPLE 11 | YES | 32.5 | 0.1625 | 99.39 | 968 | 0.22% |
| EXAMPLE 12 | YES | 32.5 | 0.1625 | 99.18 | 1192 | 0.26% |
| EXAMPLE 13 | NO | 32.5 | 0.1625 | 99.00 | 1341 | 0.30% |
| EXAMPLE 14 | YES | 32.5 | 0.1083 | 99.32 | 178 | 0.25% |
| COMPARATIVE EXAMPLE 1 | YES | 0 | 0 | 90.70 | 11628 | 2.58% |
| COMPARATIVE EXAMPLE 2 | NO | 0 | 0 | 96.27 | 1948 | 0.43% |

In Table 1, the "placed bonding material amount" refers to an amount of the bonding material applied to the bonding region 30 of the backing plate 3 in FIG. 1B. The "replenished bonding material amount" refers to an amount of the bonding material replenished in the bonding region 30 of the backing plate 3 over which the target material has passed in FIG. 1D. The "wire type" refers to the type of the wires 5 placed on the bonding region 30 of the backing plate 3 in FIG. 1A, and stainless steel was used. The "wire diameter" refers to the diameter of the wires 5. The "bonding material type" refers to the material of the bonding material, and solder made of In or Sn—Zn was used. The "target material placement position" refers to the position where the target material 2 is placed in FIG. 1C and is the distance B in the first direction D1 from the first edge 31 of the bonding region 30 of the backing plate 3 to the first edge 21 of the target material 2. The "expelling of air" refers to tapping the upper surface of the target material 2 to release the air between the target material 2 and the backing plate 3 at the stage where the edge of the target material 2 is arranged on the first edge side of the bonding region of the backing plate in FIG. 1C or the stage where the movement (slide) of the target material 2 in the first direction D1 is completed. The "target material overrun amount" means an amount of the target material 2 protruding from the bonding region 30 and is the distance A in the first direction D1 from the second edge 32 of the bonding region 30 of the backing plate 3 to the first edge 21 of the target material 2. The "replenishment of bonding material" refers to whether to replenish the bonding material.

As can be seen from Table 1, in Examples 1 to 14, the bonding rate is 97% or more and the maximum defect area is 2000 mm$^2$ or less (i.e., the proportion of the maximum defect area to the area of the bonding region is 0.6% or less). In Examples 1 to 14, the target material was hard to peel, and no peeling of the target material was confirmed even after use in the sputtering apparatus.

On the other hand, in Comparative Example 1, the bonding rate was 90.70% and the maximum defect area was 11628 mm$^2$, and in Comparative Example 2, the bonding rate was 96.27% and the maximum defect area was 1948 mm$^2$. In Comparative Examples 1 and 2, the target material was easy to peel.

The present invention is not limited to the embodiments described above and may be changed in design without departing from the spirit of the present invention.

Although the target material and the backing plate are formed in an elongated shape in the embodiments, the target material and the backing plate may have the short sides and the long sides having the same lengths.

EXPLANATIONS OF LETTERS OR NUMERALS 1, 1A sputtering target
2, 2A target material
2a sputtering surface
21 first edge
22 second edge
3, 3A backing plate
3a principal surface 30 bonding region
31 first edge
32 second edge
4 bonding material
6 bonding layer
5 wire
10 defect portion
D1 first direction
D2 second direction

The invention claimed is:

1. A sputtering target comprising:
   a backing plate; and
   a target material bonded via a bonding material to a bonding region of the backing plate, wherein
   a bonding area of a bonding portion between the target material and the backing plate accounts for 97% or more of the area of the bonding region, and wherein
   a maximum defect area of portions without the bonding material present between the target material and the backing plate accounts for 0.001% or more and 0.6% or less of the area of the bonding region, wherein
   the bonding material is made of metal or alloys having a melting point of 723K or less, and
   the bonding material consists of solder, and the solder is at least one metal selected from the group consisting of indium, tin, lead, silver, bismuth, cadmium, and antimony, or alloys thereof.

2. The sputtering target according to claim 1, wherein the area of the bonding region is 13000 mm$^2$ or more.

3. The sputtering target according to claim 1, when the target material is formed in an elongated plate shape, wherein the length of the target material in a long-side direction is 1000 mm or more and 4000 mm or less.

4. The sputtering target according to claim 1, when the target material is formed in a circular plate shape, wherein the diameter of the target material is 210 mm or more.

5. The sputtering target according to claim 2, when the target material is formed in a circular plate shape, wherein the diameter of the target material is 210 mm or more.

6. The sputtering target according to claim 1, wherein
   the sputtering target comprising a bonding layer formed of the solder between the target material and the backing plate, and wherein
   the bonding layer consists of the solder and a spacer.

* * * * *